United States Patent [19]
Sakamoto et al.

[11] Patent Number: 5,415,174
[45] Date of Patent: May 16, 1995

[54] FILTER-COEFFICIENT CONVERSION SYSTEM

[75] Inventors: George Sakamoto, Toshiyuki Sato, both of Tokyo; Morikuni Takigawa, Kagoshima; Hirotoki Kawasaki, Tokyo, all of Japan

[73] Assignee: D F C Co., Ltd., Tokyo, Japan

[21] Appl. No.: 106,901

[22] Filed: Aug. 13, 1993

[30] Foreign Application Priority Data
Aug. 13, 1992 [JP] Japan .................................. 4-216031

[51] Int. Cl.$^6$ ............................................. A61B 5/048
[52] U.S. Cl. ................................. 128/731; 364/413.05
[58] Field of Search ............................. 128/731–733; 364/724.01, 724.06, 724.08, 413.05–413.06

[56] References Cited
U.S. PATENT DOCUMENTS

| | | | |
|---|---|---|---|
| 3,826,243 | 7/1974 | Anderson | 128/732 |
| 4,800,895 | 1/1989 | Moberg et al. | 128/731 |
| 4,869,264 | 9/1989 | Silberstein | 128/731 |

*Primary Examiner*—Angela D. Sykes
*Attorney, Agent, or Firm*—McGlew & Tuttle

[57] ABSTRACT

A filter-coefficient conversion system relating to n pieces of digital filters for obtaining n pieces of frequency components in a desired frequency band using filter coefficients a(i, j) (where i=0, - - - $m_j$, j=1, - - - n) described in a given filter-bank table, comprising a first transfer-function processing device for obtaining transfer functions H(a(i, j)) for the filter coefficients a(i, j) corresponding to each filter (j) in a desired frequency band, a variable-range generating device for generating gradually value-changing ranges RANGE (m), a second transfer-function processing device for obtaining new converted filter coefficients A (i, j) having rounded integer values based on the filter coefficients a (i, j) in the filter-bank table, preparing a filter-bank table thereof, and obtaining transfer functions H(A (i. j)) for the converted filter coefficients A (i, j), and an evaluating device for carrying out evaluation processing with respect to a given degree of tolerance.

2 Claims, 6 Drawing Sheets

FIG. 1

| $a_{01}$ | $a_{11}$ · · · · · · | $a_{i1}$ · · · · · · | $a_{m_1 1}$ |
|---|---|---|---|
| $a_{02}$ | $a_{12}$ · · · · · · | $a_{i2}$ · · · · · · | $a_{m_2 2}$ |
| ⋮ | | | |
| $a_{0j}$ | $a_{1j}$ · · · · · · | $a_{ij}$ · · · · · · | $a_{m_j j}$ |
| ⋮ | | | |
| $a_{0n-1}$ | $a_{1n-1}$ · · · · · · | $a_{in-1}$ · · · · · | $a_{m_{n-1} n-1}$ |
| $a_{0n}$ | $a_{1n}$ · · · · · · | $a_{in}$ · · · · · · | $a_{m_n n}$ |

…

FILTER-COEFFICIENT CONVERSION SYSTEM

BACKGROUND OF THE INVENTION AND RELATED ART STATEMENT

This invention relates generally to a filter-coefficient conversion system, and more particularly to a filter-coefficient conversion system for converting filter coefficients used for digital filters that can analyze and display biological signals, such as a brain wave, essentially in real time.

Digital filters are used for extracting the spectral distribution of biological signals, as described in U.S. patent application Ser. No. 07/794,526 previously proposed by the present Applicants, for example.

The conceptual block diagram of digital filter is shown in FIG. 6. In FIG. 6, $\Delta T$ refers to a time-delay element, x to a multiplication element, and + to an addition element, respectively. The block diagram shown in FIG. 6 is concerned with a digital filter configured with wired circuits. In practice, spectrum is calculated by computer processing using coefficients $a_{ij}$ held in a filter-bank table.

FIG. 1 shows the configuration of a filter-bank table. By using the filter coefficients, the instantaneous power at time k at which a digitized time-series input signal $\{X_i\}$ is input to the j-th filter can be obtained by the following equation in an FIR filter.

$$dp(j,k) = \sum_{i=-mj}^{mj} a_{ij} X_{k-i} \quad (1)$$

It follows from this that assuming that the integration weight coefficient is $W(k)$ ($k=-1, \cdots, 1$), the power $P(j)$ when the time-series input signal $\{X_i\}$ is input can be obtained from the following equation, and thus, the power spectrum for a desired frequency band can be obtained.

$$p(j) = \sum_{k=1}^{1} W(k) dp(j,k) \quad (2)$$

To obtain a power spectrum in this manner, however, $$2 \sum_{j=1}^{n} mj + n$$

times of multiplications must be performed, as can be seen from Equations (1) and (2) above. This results in the need for a long multiplication time, posing a problem that when signal components in a desired frequency band are extracted from the above-mentioned biological signals, the number of multiplications is too many to be processed in real time with a small computer of a size of 1-chip microcomputer.

SUMMARY OF THE INVENTION

This invention is intended to solve the aforementioned problems. It is an object of this invention to provide a filter-coefficient conversion system for obtaining such filter coefficients that can reduce the number of multiplications in multiplying integers so as to enable a small computer of a size of 1-chip microcomputer to perform real-time processing.

BRIEF DESCRIPTION OF THE DRAWINGS

FIG. 1 is a diagram illustrating the configuration of a filter-bank table being converted.

DETAILED DESCRIPTION OF THE EMBODIMENTS

Figure 2:
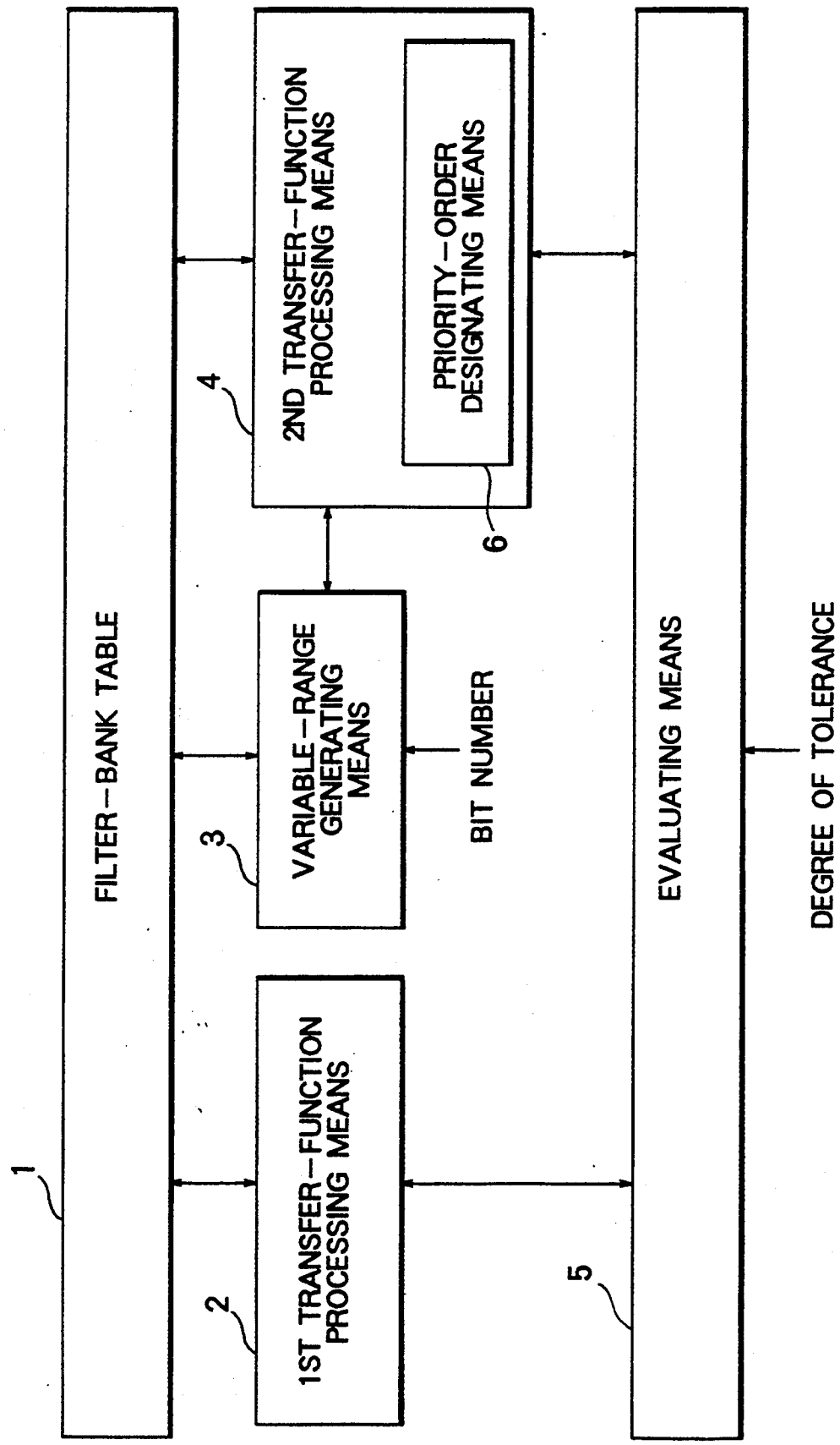
FIG. 2 is a diagram illustrating the operating principle of this invention.

FIG. 2 is a diagram illustrating the operating principle of this invention.

In the figure, reference numeral 1 refers to a filter-bank table, 2 to a first transfer-function processing means, 3 to a variable-range generating means, 4 to a second transfer-function processing means, 5 to an evaluating means, and 6 to a priority-order designating means, respectively.

In the filter-bank table 1, are stored predetermined filter coefficients $a_{ij}$ (hereinafter referred to as a(i, j)) (j=1, 2, ---, n, i=0, 1, ---, $m_j$) for each filter (j) for extracting certain frequency components in a desired frequency band, as shown in FIG. 1. These filter coefficients a(i, j) are normally real numbers.

Figure 6:
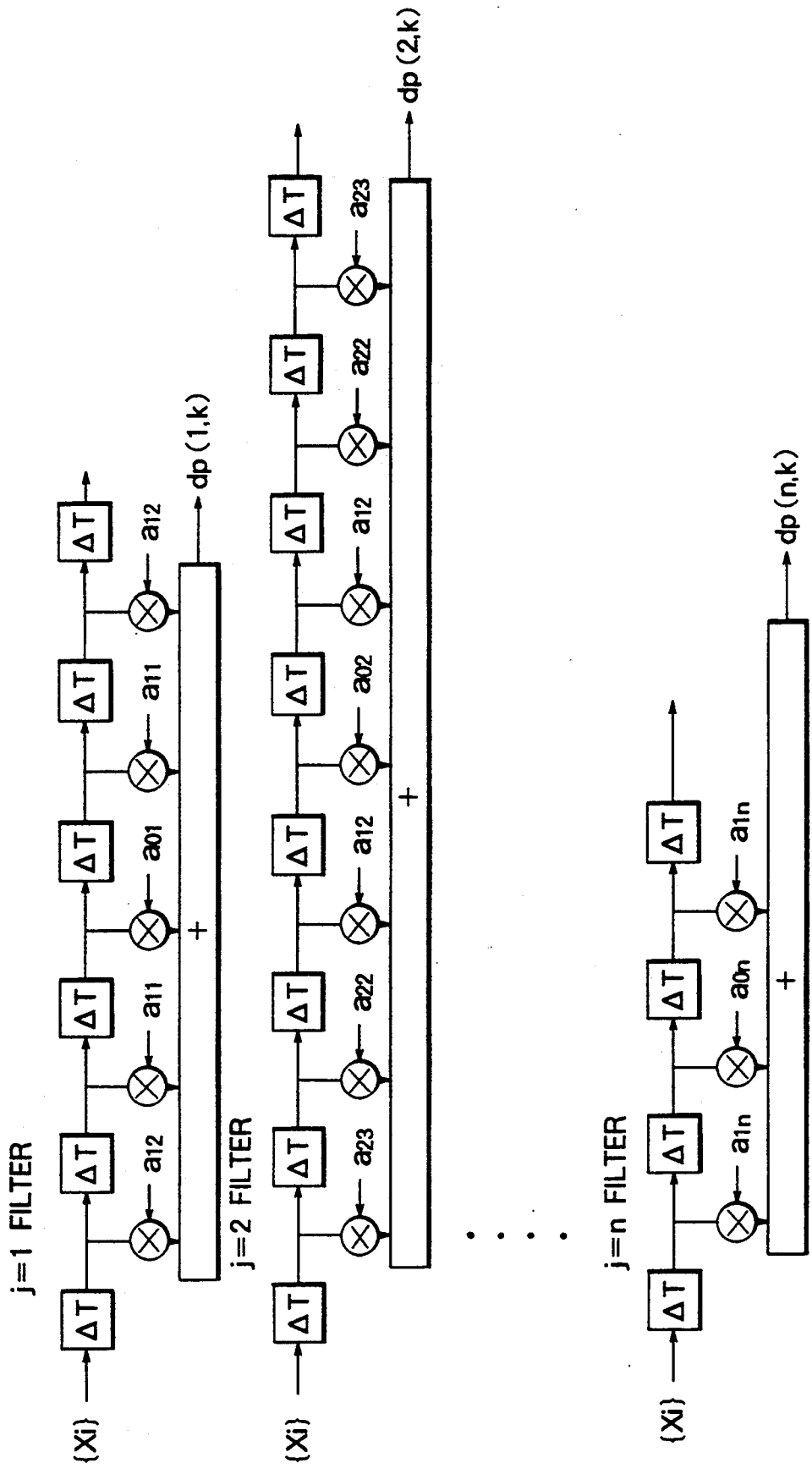
FIG. 6 is a diagram of assistance in explaining the concept of digital filter.

In FIG. 2, the first transfer-function processing means 2 obtains transfer functions H(a(i, j)) for the filter coefficients a(i, j) stored in the filter-bank table 1 with the following equation, and holds the transfer functions as a table.

$$H(a(i,j)) = \sum_{i=-mj}^{mj} a_{ij} e^{I 2\pi f \cdot i \cdot \Delta T}$$

where I:
Symbol representing an imaginary number
$\Delta T$: Time delay of the time-delay element shown in FIG. 6

The variable-range generating means 3 chooses the maximum absolute values max (a(i, j)) in the filter coefficients a(i, j) for each filter (j) from the filter-bank table 1, and further detects the maximum value MAX (a(i, j)) from among n pieces of the filters. The variable-range generating means 3 generates gradually value-changing ranges RANGE (i) in accordance with a bit number given from the outside, based on the maximum value S of a range of integer coefficients that can be taken with the bit number. The initial range is assumed to be such that RANGE (m)=MAX (a(i, j)). If the bit number given from the outside is assumed to be "8," for example, then the value S is "127" because values ranging from −127 to +128 can be expressed.

The second transfer-function processing means 4 performs the operation of $\{a(i, j)/RANGE (m)\} \cdot S$ for the filter coefficients a(i, j) sequentially read from the filter-bank table 1 with the maximum value S of the aforementioned range of integer coefficients, and rounds the operation results to convert into new integer converted filter coefficients A(i, j). Multiplying a(i, j) by S/RANGE (m) means that if a(i, j) is equal to MAX(a(i, j)), assuming RANGE (m)=MAX(a(i, j)), $$\{a(i,j)/\text{RANGE}(m)\}\cdot S = \{\text{MAX}(a,j)/\text{MAX}(a,j)\}\cdot = S,$$

thus, the coefficient A(i, j) as the conversion result of a(i, j) is converted to a value of S. The converted filter coefficients A(i, j) are finally determined by taking into consideration the priority order designated by the priority-order designating means 6, which will be described later. The rounded new converted filter coefficients A(i, j) prior to the final determination are held as a table in a form corresponding to the filter coefficients a(i, j) shown in FIG. 1. The transfer functions H(A(i, j)) for the converted filter coefficients A(i, j) are obtained and held as a table, as in the case of the first transfer-function processing means 2 described above.

The evaluating means 5 evaluates the degree of tolerance to the ideal curve, using the absolute-sum evaluation, the least-squares evaluation, or the complex Chebyshev evaluation, for example, based on the transfer functions H(a(i, j)) and H(A(i, j)) derived from the first and second transfer-function processing means 2 and 4, respectively.

The priority-order designating means 6 finally determines the converted filter coefficients A(i, j) so that the number of additions and multiplications can be minimized when extracting each frequency component in a desired frequency band by applying the converted filter coefficients A(i, j) to the digital time-series input signals $\{X_i\}$, and chooses the converted filter coefficients A(i, j) in the following priority order.

(1) Choosing combinations having more A(i, j)=0 from among A(i, j) to minimize the required number of multiplications.

(2) Choosing combinations having more |A(i, j)|=0 when the frequency distribution of |A(i, j)| is calculated to minimize the required number of multiplications.

(3) Choosing combinations having more |A(i, j)| having the same value from among |A(i, j)| to minimize the required number of multiplications.

To perform this choice, evaluation is performed of the "combinations of the converted filter coefficients A(i, j)" obtained when the variable-range generating means 3 gradually steps up range coefficients, using the corresponding transfer functions H(a(i, j)) and H(A(i, j)) obtained by the first and second transfer-function processing means 2 and 4. That is, the evaluating means 5 performs evaluation so that combinations of the converted filter coefficients A(i, j) can be obtained within the range of a predetermined degree of tolerance, using an appropriate evaluating formula, such as the absolute sum evaluation formula. The evaluating means 5 then obtains combinations of the most desirable converted filter coefficients A(i, j), taking into account the aforementioned priority order determined by the priority-order designating means 6, and uses them for digital filters for extracting the biological signals.

Figure 3:
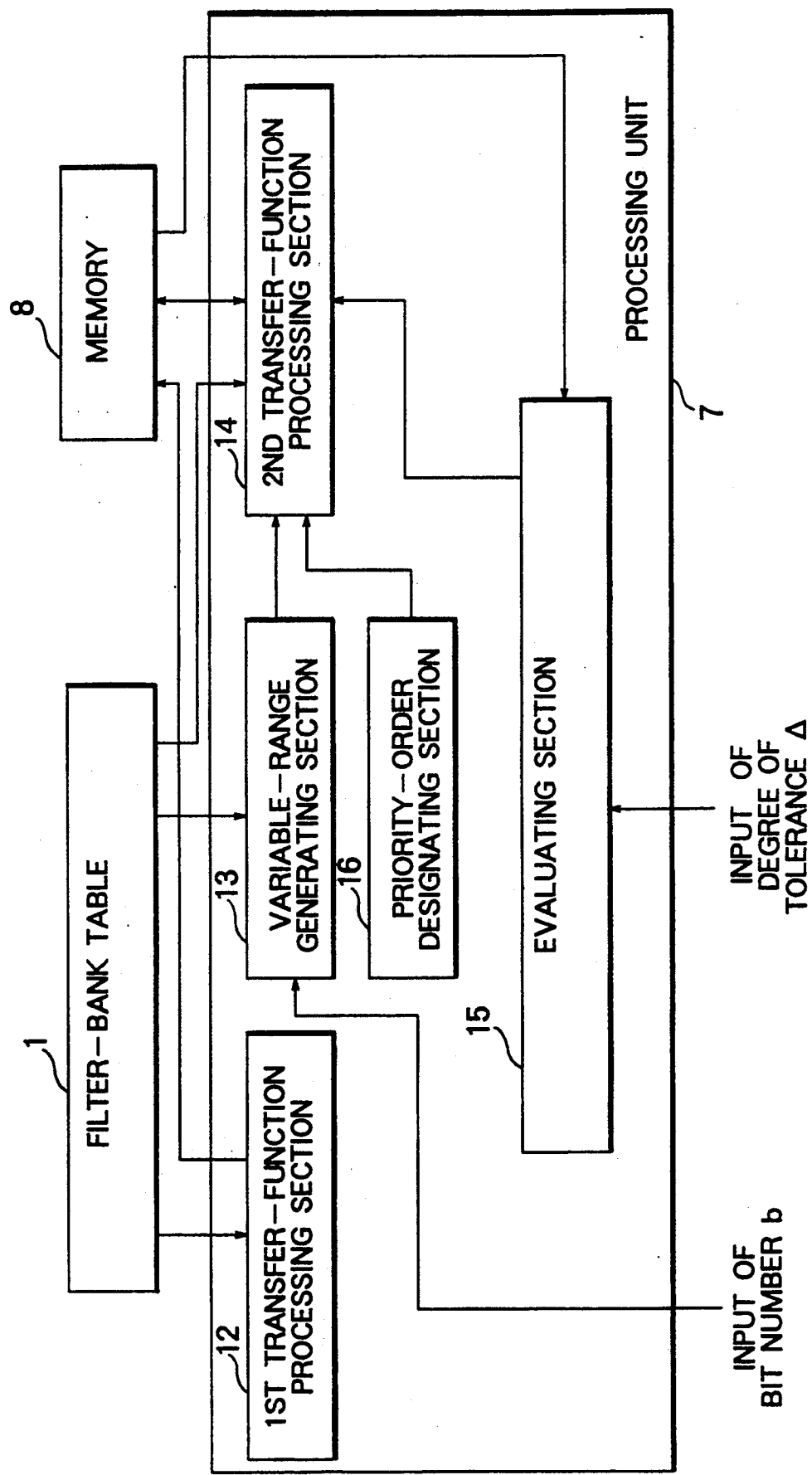
FIG. 3 is a diagram illustrating the construction of a filter-coefficient conversion system embodying this invention.

FIG. 3 shows the construction of a filter-coefficient conversion system embodying this invention.

In the figure, reference numeral 1 refers to a filter-bank table corresponding to that shown in FIG. 2; 7 to a processor unit; 8 to a memory; 12 to a first transfer-function processing section; 13 to a variable-range generating section; 14 to a second transfer-function processing section; 15 to an evaluating section; and 16 to a priority-order designating section, respectively.

The processor unit 7 is a computer, and the data processed in the processor unit 7 is stored in the memory 8.

The first transfer-function processing section 12 corresponds to the first transfer-function processing means 2 shown in FIG. 2, and the transfer functions H(a(i, j)) obtained in the first transfer-function processing section 12 are stored on predetermined addresses in the memory 8, as described above.

Similarly, the variable-range generating section 13, the second transfer-function processing section 14, the evaluating section 15 and the priority-order designating section 16 correspond to the variable-range generating means 3, the second transfer-function processing means 4, the evaluating means 5 and the priority-order designating means 6 shown in FIG. 2, respectively. The converted filter coefficients A(i, j) and the transfer functions thereof H(A(i, j)) obtained in the second transfer-function processing section 14 are stored on predetermined addresses in the memory 8.

The evaluating section 15 reads the transfer functions H(a(i, j)) and H(A(i, j)) stored in the memory 8, and evaluates them based on a predetermined evaluating formula, such as the absolute sum, least squares, or complex Chebyshev evaluation formula, using a degree of tolerance $\Delta$ given from the outside.

A bit number b for designating the range of integer coefficients, $S=2^b$ is given from the outside to the variable-range generating section 13. The symbol b for determining the range S of integer coefficients represents a bit number that can be processed by a calculating unit 9 shown in FIG. 5, that is, a one-chip microcomputer, as will be described later.

Figure 4:
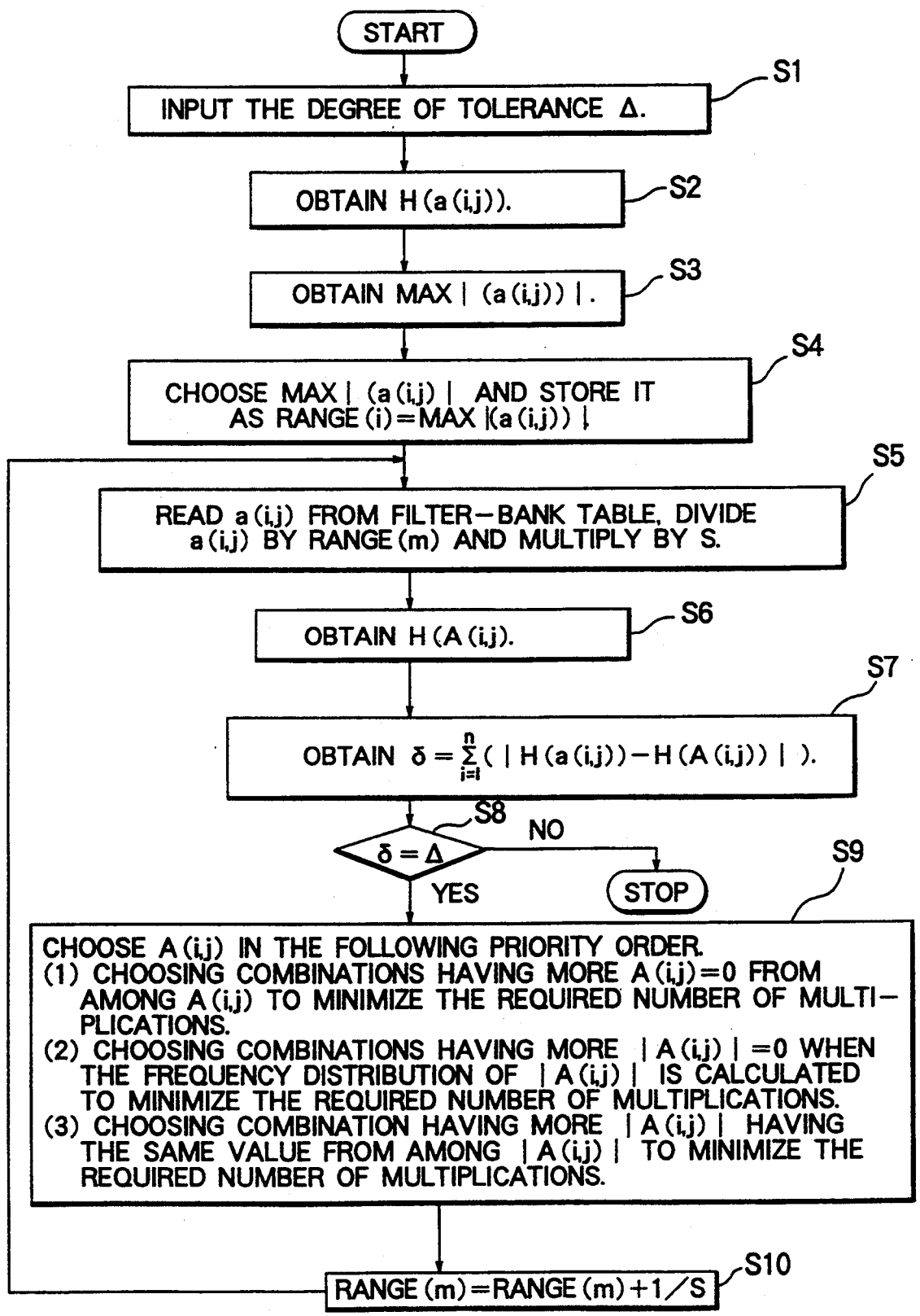
FIG. 4 is a flow chart of an embodiment of this invention.

The operation of the filter-coefficient conversion system of this invention having the aforementioned construction will be described in the following, referring to the flow chart shown in FIG. 4.

Figure 5:
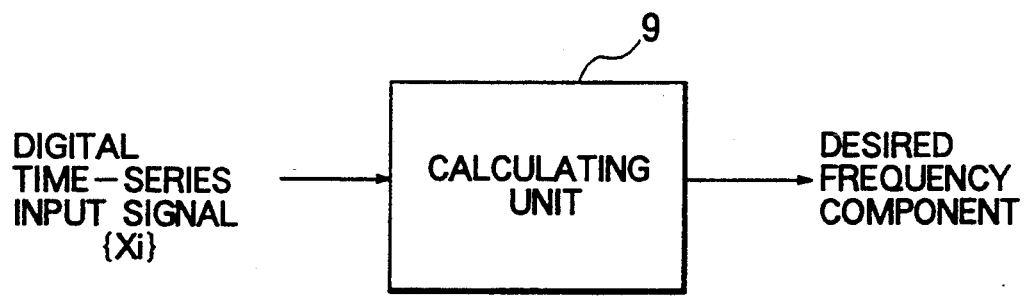
FIG. 5 is a diagram illustrating the input and output of the digital filter.

Assuming that the bit number b being processed by the calculating unit 9 shown in FIG. 5 is 8 bit, for example, the bit number b=8 determining the range $2^b$ of integer coefficients is input into the processor unit 7 shown in FIG. 3 to prevent the occurrence of overflow.

Under these conditions, the degree of tolerance $\Delta$ as the criterion for evaluation in the evaluating section 15 is input into the processor unit 7 (Step S1).

The first transfer-function processing section 12 sequentially reads the filter coefficients a(i, j) in the first line in the filter-bank table 1, obtains the transfer functions thereof H(a(i, j)), and stores on predetermined addresses in the memory 8. Similarly, transfer functions H(a(i, j)) are obtained based on filter coefficients a(i, j) up to the n-th line in the filter-bank table 1 (Step S2), and stored on predetermined addresses in the memory 8.

The variable-range generating section 13 in FIG. 3 detects by each line (j) in the filter-bank table 1 the maximum absolute values max |(a(i, j))| among the filter coefficients belonging to the line (j) (Step S3), and further detects the maximum value among the max |(a(i, j))| and designates the maximum value as MAX |(a(i, j))|, and stores as MAX |(a(i, j))| =RANGE (m) (Step S4).

Next, the second transfer-function processing section 14 in FIG. 3 sequentially reads filter coefficients a(i, j) from the first line in the filter-bank table 1, normalizes the read filter coefficients a(i, j) by dividing them by the RANGE (m) stored in the variable-range generating section 13, and multiplies a(i, j)/RANGE (m) by a number S in the range where integer coefficients can be taken with the bit number b set in the variable-range generating section 13; that is, multiplies a(i, j)/RANGE (m) by the largest integer S=127 that causes no overflow within the range from −127 to 128 when the bit number b=8 (although the maximum value is 128, the value of 128 is not used because when 128 is used as S, the result is confused with a negative value when an overflow occurs).

The values thus obtained are rounded (by counting fractions of 5 or over as a unit and disregarding the rest, or by rounding up, or by rounding off) to convert into rounded converted filter coefficients A(i, j) (Step S5). The rounded converted filter coefficients A(i, j) are stored on predetermined addresses in the memory 8.

The second transfer-function processing section 14 further obtains the transfer functions H(A(i, j)) based on the converted filter coefficients A(i, j) from the first to the n-th lines, and stores them on predetermined addresses in the memory 8 shown in FIG. 3 (Step S6).

The evaluating section 15 in FIG. 3 reads the corresponding transfer functions H(a(i, j)) and H(A(i, j)) stored in the memory 8, obtains the evaluated values $\delta$ in accordance with the absolute sum evaluation formula (Step S7), and when the evaluated values $\delta$ is larger than the degree of tolerance $\Delta$ input in Step S1, determines as the final values the converted filter coefficients A(i, j) obtained in the second transfer-function processing section 14 and stored in the memory 8 (Step S8).

In Step S8, when the evaluated values $\delta$ is smaller than the degree of tolerance $\Delta$, the evaluating section 15 in FIG. 3 asks the second transfer-function processing section 14 to calculate new rounded converted filter coefficients A(i, j) in the next priority order designated by the priority-order designating section 16 (Step S9). At this time, the variable-range generating section 13 in FIG. 3 asks to calculate new converted filter coefficients A(i, j) by stepping up RANGE (i) in 1/S increments, that is, by changing S in Step 5 from 127 to 126 (Step S10).

The order of priority designated by the priority-order designating section 16 are in the order of:
(1) Choosing combinations having more A(i, j)=0 from among A(i, j) to minimize the required number of multiplications.
(2) Choosing combinations having more |A(i, j)|=0 when the frequency distribution of |A(i, j)| is calculated to minimize the required number of multiplications.
(3) Choosing combinations having more |A(i, j)| having the same value from among |A(i, j)| to minimize the required number of multiplications.

The processor unit 7 steps up the range, that is, gradually changes S to 126, 125, 124, - - -, and repeats Steps S5 through S10 until the evaluated value $\delta$ becomes larger than the degree of tolerance $\Delta$.

In this way, a filter bank of the finally determined new converted filter coefficients A(i, j) is prepared in the memory 8.

In the filter bank of the converted filter coefficients A(i, j), the coefficients have been rounded, and have such characteristics that there are many combinations of A(i, j)=0; there are many combinations having |A(i, j)|=0 when the frequency distribution of |A(i, j)| is calculated; and there are a large number of the same values in |A(i, j)|.

Since the converted filter coefficients A(i, j) have many combinations having A(i, j)=0 and the same values, they can be stored in a memory having a small capacity in the form of a punch-type filter bank, and the calculating unit 9 shown in FIG. 5 can be constructed by a 1-chip LSI. Since the converted filter coefficients are integers, the calculating speed in the calculating unit 9 can be increased. Furthermore, the number of multiplications and addition can be reduced because there are many combinations having A(i, j)=0 and the same values, and the number of references to a multiplication table, when prepared, can be reduced. Thus, a filter bank that can reduce calculating time will result.

Although description has been made in the foregoing about evaluation in the evaluating section 15 using the absolute sum evaluating formula, evaluation can be made using other evaluating formula, such as the least squares evaluation, or the complex Chebyshev evaluation formula can be employed.

As described above, this invention makes it possible to convert filter coefficients given in real numbers in a filter bank into a filter bank of newly rounded converted filter coefficients, and to obtain a filter bank in which the number of multiplications and additions can be substantially reduced because the optimum rounding method is employed.

Consequently, the required capacity of memory can be reduced by using such a filter bank. Index data may be included in the multiplication table. Filters can be built with a 1-chip LSI. In addition, the time required for filtering can be improved.

What is claimed:

1. A filter-coefficient conversion system using digital filters having such a construction as to extract desired frequency components from digital time-series input signals $\{X_i\}$ using filter coefficients $a_{ij}$ in a given filter bank characterized in that said filter-coefficient conversion system comprises
   a first transfer-function processing means for obtaining transfer functions H(a(i, j)) for said filter coefficients $a_{ij}$ corresponding to filters (j) for said desired frequency components being extracted,
   a variable-range generating means for detecting the maximum filter coefficients in said filter bank, and generating gradually variable ranges RANGE (m) based on a range S of integer coefficients that can take in accordance with a given bit number,
   a second transfer-function processing means for generating rounded converted filter coefficients $A_{ij}$ corresponding to said filter coefficients $a_{ij}$ from said filter coefficients $a_{ij}$ in said filter bank and said ranges RANGE (m) generated by said variable-range generating means, and obtaining transfer coefficients H(A(i, j)) for said rounded converted filter coefficients $A_{ij}$ corresponding to filters (j) for said desired frequency components being extracted, and
   an evaluating means for evaluating said transfer functions H(a(i, j)) and H(A(i, j)) obtained from said first and second transfer-function processing means in terms of a given degree of tolerance, and producing a filter bank of new rounded converted filter coefficients $A_{ij}$.

2. A filter-coefficient conversion system as set forth in claim 1 wherein said second transfer-function processing means has a priority-order designating means for having said second transfer-function processing means prepare said converted filter coefficients $A_{ij}$ in the order of 1) there are many combinations having $A_{ij}=0$ among whole converted filter coefficients $A_{ij}$ in a filter bank being produced, 2) there are many combinations having $|A_{ij}|=0$ in the calculated distribution of $|A_{ij}|$, and 3) there are many identical values among $|A_{ij}|$, and produces a filter bank of new rounded converted filter coefficients $A_{ij}$.

* * * * *